United States Patent [19]
Mueller et al.

[11] Patent Number: 5,239,204
[45] Date of Patent: Aug. 24, 1993

[54] ELECTRONIC PROXIMITY SWITCH DEPENDENT UPON A MAGNETIC FIELD

[75] Inventors: Jens Mueller, Radevormwald; Andreas Nest, Herne, both of Fed. Rep. of Germany

[73] Assignee: Werner Turck GmbH & Co. KG, Fed. Rep. of Germany

[21] Appl. No.: 650,892

[22] Filed: Feb. 5, 1991

[30] Foreign Application Priority Data

Feb. 6, 1990 [DE] Fed. Rep. of Germany ....... 4003426

[51] Int. Cl.⁵ .............. H01H 35/00; G01B 7/14; G08C 19/06
[52] U.S. Cl. .................. 307/116; 324/207.16; 324/207.26; 336/178; 340/870.36
[58] Field of Search .............. 324/207.15, 207.16, 324/207.26, 236, 237, 157; 342/42; 455/41; 340/825.54, 870.31, 870.32, 870.36, 572; 307/309, 116; 361/179, 180; 336/178

[56] References Cited

U.S. PATENT DOCUMENTS

| | | | |
|---|---|---|---|
| 4,011,510 | 3/1977 | Olsen | 324/157 |
| 4,719,362 | 1/1988 | Nest et al. | 307/116 |
| 4,841,163 | 6/1989 | Mueller | 307/116 |

FOREIGN PATENT DOCUMENTS

| | | | |
|---|---|---|---|
| 3133048 | 4/1982 | Fed. Rep. of Germany | 324/207.15 |
| 0308917 | 12/1989 | Japan | 324/207.15 |

*Primary Examiner*—A. D. Pellinen
*Assistant Examiner*—Richard T. Elms
*Attorney, Agent, or Firm*—Antonelli, Terry, Stout & Kraus

[57] ABSTRACT

An electronic proximity switch dependent upon a magnetic field includes an HF resonant circuit adapted to be influenced by an approaching magnetic trigger. A coil arrangement includes a member drivable into magnetic saturation, with the member including an amorphous or predominantly amorphous metallic band of high permeability. A coil bobbin for accommodating the resonant circuit coil and the drivable member is made of a synthetic resin enriched with a pulverulent permeable material.

15 Claims, 2 Drawing Sheets

ELECTRONIC PROXIMITY SWITCH DEPENDENT UPON A MAGNETIC FIELD

FIELD OF THE INVENTION

The present invention relates to an electronic proximity switch dependent upon a magnetic field and adapted to be actuated by an approaching magnetic trigger.

BACKGROUND OF THE INVENTION

Proximity switches of the aforementioned type are generally provided with an HF (high frequency) resonance circuit which is adapted to be influenced by a magnetic trigger, in an oscillator circuit, with a coil arrangement having a member magnetizable by the magnetic field of the trigger. The member is drivable into magnetic saturation starting with a specific magnetic field strength by the external magnetic field of the trigger with reduction in the damping of the resonance circuit. The magnetizable member may, for example, consist of an amorphous or predominantly amorphous metallic band of high permeability, with losses of the band, which determine the oscillation state of the oscillator circuit, decreasing with an increase in magnetic saturation.

Various embodiments of a proximity switch of the aforementioned type are proposed in, for example, EP Laid-Open Application 0,218,042 wherein, in all of the embodiments, the coil arrangement includes a resonance circuit coil and a coupling coil arranged on a joint bobbin. In one of the proposed embodiments a "Hartley Circuit" is utilized for the oscillator, and in the other proposed embodiment, a Meissner circuit is employed.

One common feature of the above mentioned conventional circuits used in such proximity switches resides in the fact that the circuit oscillators operate with two windings or with a tapped coil since these types of circuits, as is known, can be dimensioned with special ease so that a uniform reproducible starting and stopping of the oscillation is readily obtainable, with a corresponding amplitude curve being respectively produced during the damping reduction and damping of the coil arrangement.

However, a disadvantage of the above noted conventional circuits resides in the fact that two windings or coil taps are required during the manufacturing which not only increases the manufacturing costs but also a further processing of the coil with, for example, three or four terminals, requires a considerable amount of operational steps and labor and is also prone to errors. Moreover, the basic losses in the conventional coil arrangement are high and, for this purpose, the use of conventional coil arrangements presents some difficulties especially in integrated switching circuits.

SUMMARY OF THE INVENTION

The aim underlying the present invention essentially resides in providing an electronic proximity switch arrangement of the aforementioned type which is capable of considerably lowering the basic coil losses.

In accordance with advantageous features of the present invention, a coil bobbin of the resonant circuit coil is fashioned from a synthetic resin, with the synthetic resin being enriched with a pulverulent permeable material. By virtue of the above noted features of the present invention, the resonant circuit coil exhibits only relatively low losses due to the filling of the synthetic resin bobbin with the permeable material.

Preferably, in accordance with the present invention, the pulverulent permeable material includes carbonyl iron and, therefore, the oscillation can be maintained with a smaller supply of energy and an improved stability can be obtained.

In accordance with still further features of the present invention, the coil arrangement of the HF resonant circuit may comprise only a single coil thereby resulting in a lowered coil manufacturing cost and, since the coil has a smaller value by virtue of the elimination of the second winding, it is possible to further reduce the overall structural size.

Yet further advantages of the present invention reside in the fact that almost all of the structural parts of the oscillator circuit can be contained in only one integrated switching circuit, and the individual proximity switches may be manufactured with a substantially greater uniformity since the coupling tolerances are eliminated, which tolerances are unavoidable in arrangements with coupling coils.

Advantageously, in accordance with further features of the present invention, the mounting elements for the amorphous metallic band are also manufactured from a synthetic resin enriched with a pulverulent permeable material.

Advantageously, a resonant circuit coil is wound from an enamelled copper wire or from a high-frequency braided wire.

The mounting elements may, in accordance with the present invention, be constructed as flanges of a coil bobbin which are, in a diametrical dimension and in the axial direction, in each dimension, larger by a multiple of the central core, with the coil bobbin including an annular gap which penetrates the oscillator coil. The gap is adapted to accommodate the amorphous metallic band.

The above and other objects, features, and advantages of the present invention will become more apparent from the following description when taken in connection with the accompanying drawings which show, for the purposes of illustration only, one embodiment in accordance with the present invention.

DETAILED DESCRIPTION

Figure 1:
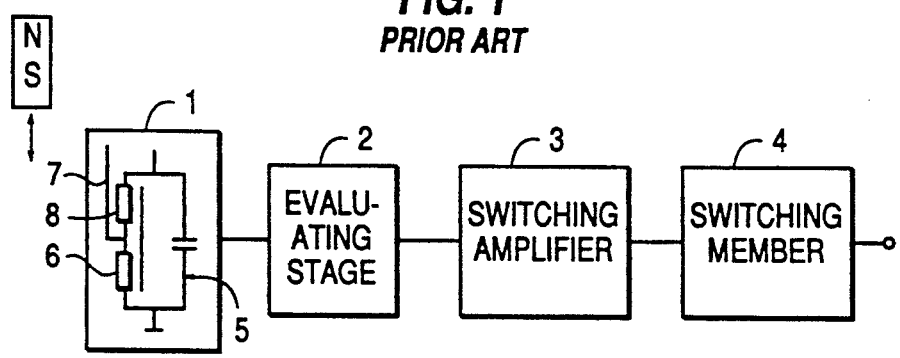
FIGS. 1 and 2 are block circuit diagrams of conventional proximity switches disclosed in EP-OS 218,042.

Referring now to the drawings wherein like reference numerals are used throughout the various views to designate like parts and, more particularly, to FIG. 1, according to this figure, a conventional proximity switch, activatable by a magnetic trigger NS, includes an oscillator portion 1, and evaluating stage 2, a switching amplifier 3, and a switching member 4, with the switching member 4 including a switching transistor or, preferably, a thyristor. The oscillator portion 1 includes an HF resonant circuit 5 with a resonant circuit coil 6 and a tap 7. A portion of the resonant circuit coil 6 functions as a coupling coil 8 whereby the oscillator portion 1 can be operated, for example, in a so-called Hartley circuit. In a Hartley circuit, the objective is attained by way of the coil tap that the voltage fed back to the amplifier input, for example, in the case of an emitter circuit, to the base of the transistor, is phase-shifted by 180° with respect to the amplifier output voltage, for example, the collector voltage, so that a positive feed back is produced whioh, together with the amplification of the transistor, brings about the oscillatory capability.

Figure 2:
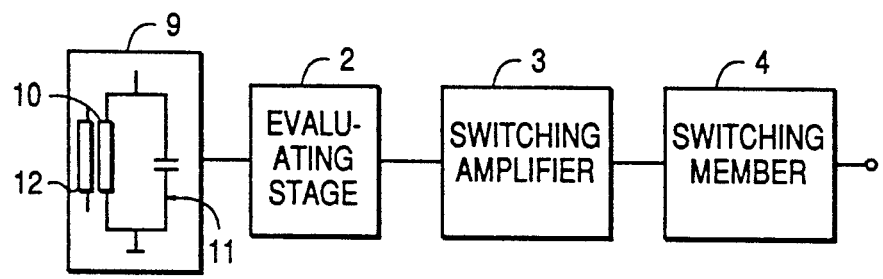

FIG. 2 provides an alternate conventional arrangement of the resonant circuit coil with two separate windings, namely, an actual resonant circuit coil 10 in the resonant circuit 11 and a coupling coil 12. This arrangement can preferably be utilized in the so-called Meissner circuit wherein feedback, required for a build-up of oscillation, is obtained with the second coil, for example, the coupling coil 12, by feeding the voltage induced in the coupling coil 12, in the corresponding phase position shifted by 180° at the amplifier input, for example, to the base of a transistor, whereas, the resonant circuit coil 10, together with the capacitor, is connected in the output circuit of the amplifier. In both oscillator portions 1, 9 of FIGS. 1, 2, the coupling coils 8 or 12 are utilized in addition to the resonant coil 6 or 10. This arrangement has proven not to be an optimum arrangement with respect to structural size and also operational reliability.

Figure 3:
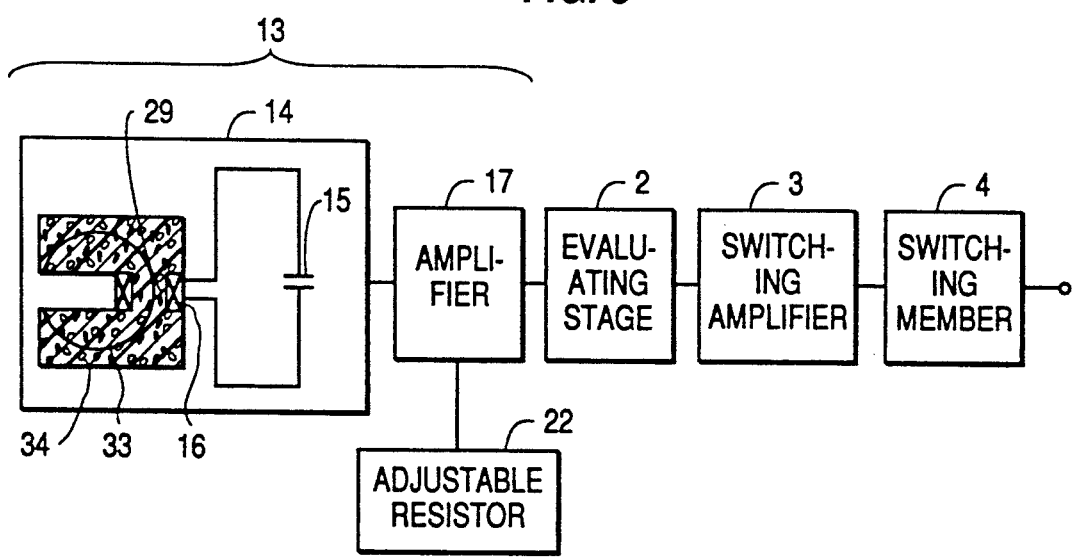
FIG. 3 is a block circuit diagram of a proximity switch constructed in accordance with the present invention.
Figure 4:
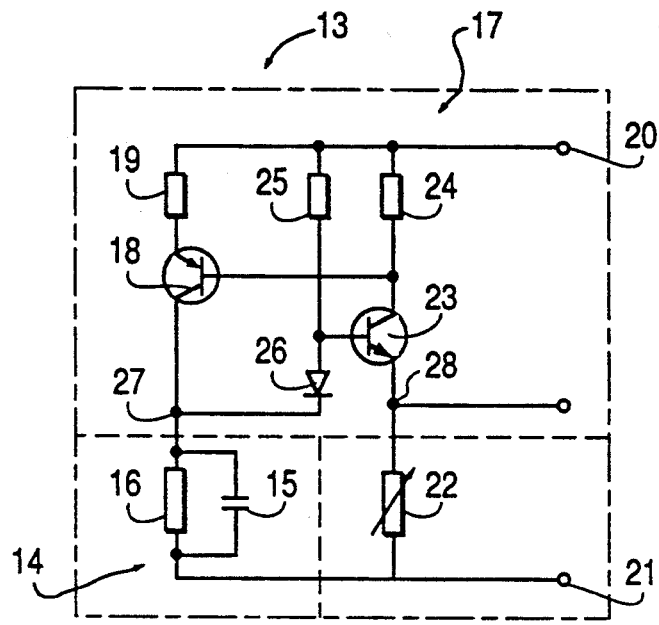
FIG. 4 is an oscillator circuit of a proximity switch of the present invention.

In contradistinction to the constructions illustrated in FIGS. 1 and 2, in the proximity switch according to the present invention shown in FIGS. 3 and 4, the oscillator circuit 13 contains a resonant circuit 14 including a capacitor 15, a resonant circuit coil 16 with only one winding, and an amplifier portion 17 of an oscillator circuit 13 specifically tuned thereto. Enamelled copper wire or high-frequency wire is utilized for the resonant circuit coil 16. The resonant circuit is connected through the collector-emitter path of a transistor 18 and a resistor 19 to the terminals 20, 21 for a voltage supply. a series circuit is provided between the terminals 20, 21 and includes an adjustable resistor 22, an emitter-collector path of a transistor 23, and a resistor 24 and lies in parallel to the resonant circuit 14. The base of the transistor 18 is connected to the collector of the transistor 23, while the base of the transistor 23 is connected, through a resistor 25, to terminal 20 and, through a diode 26, to a circuit point 27 between the resonant circuit 14 and the collector of the transistor 18.

In the above described circuit, the transistors 18 and 23 constitute the amplifier portion. The positive feedback required for the resonant circuit excitation is derived from the collector circuit of the transistor 23 and the coupling of the transistor 23 into the circuit simultaneously effects the needed phase reversal. The resistors 19, 24, 25 serve for setting the operating points of the transistors. The sensitivity of the arrangement can be adjusted by the variable resistor 22. The output voltage of the oscillator is derived from a circuit point 28 between the emitter of the transistor 23 and the variable resistor 22 for further connected circuit portions such as the evaluating stage 2, switching amplifier 3, and the switching member 4, all of which are conventional in construction.

Figure 5:
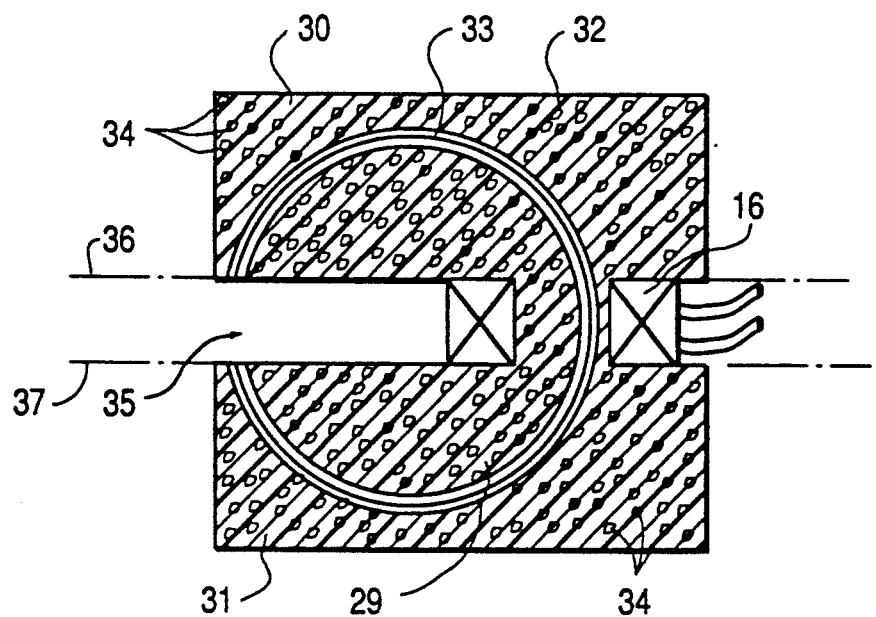
FIG. 5 is a schematic cross-sectional view of a coil arrangement of an HF resonance circuit adapted to be influenced in the manner of a sensor.

As shown in FIG. 5, the resonant circuit coil 16 is wound on a synthetic resin coil bobbin 29 including flanges 30, 31 each of which are in a diametrical dimension and in an axial dimension larger by a multiple than the central core. The flanges 30, 31 extend toward one side diametrically with respect to the resonant circuit coil 16. An annular gap is cut or formed in the flanges 30, 31 and in the central core of the coil bobbin 29. An annular amorphous metal band 33 is inserted or accommodated in the gap 32. The coil bobbin 29 and the flanges 30, 31 serving as the mounting means, are enriched with a pulverulent permeable material 34 whereby the inductance of the resonant circuit coil 16 is increased. The metallic band 33 penetrates the coil 16 and is bent or shaped into an open ring, with an opening 35 of the ring lying between planar surfaces 36, 37 defined by end faces of the torus of the resonant circuit coil 16.

FIGS. 3 and 4 schematically illustrate the principle of the circuit arrangement of the present invention and, in a concrete realization, the components of the amplifier portion 17, namely, the transistors 18, 23, resistors 19, 24, 25 and adjustable resistor 22 form components of an integrated switching circuit which can also encompass the switching stages 2 and 3 as well.

While we have shown and described only one embodiment in accordance with the present invention, it is understood that the same is not limited thereto but is susceptible to numerous changes and modifications as known to one of ordinary skill in the art, and we therefore do not wish to be limited to the details shown and described herein, but intend to cover all such modifications as are encompassed by the scope of the appended claims.

We claim:

1. An electronic proximity switch dependent upon a magnetic field and actuatable by an approaching magnetic trigger, the switch comprising an HF resonant circuit adapted to be influenced by the magnetic trigger, in an oscillating circuit including a resonant circuit coil having a member magnetizable by a magnetic field of a magnetic trigger and being drivable into a magnetic saturation starting with a specific magnetic field strength by a magnetic field of the magnetic trigger with a reduction in a damping of the resonant circuit, a coil bobbin for the resonant circuit coil fashioned of a synthetic resin containing a pulverulent permeable material, wherein said magnetizable member is fashioned of a metallic band of a high permeability, said coil bobbin includes a pair of flanges having an axial and diametrical dimension, said axial and diametrical dimensions being larger than a multiple of a central core of the coil bobbin, said coil bobbin further including an annular gap penetrating the resonant circuit coil for accommodating the metallic band, and wherein the metallic band penetrates the coil bobbin and is bent into the form of an opening ring, with the opening of the ring lying between planar surfaces defined by end faces of a torus of the coil bobbin.

2. A proximity switch according to claim 1, wherein the coil means includes only a single coil element.

3. A proximity switch according to one of claims 1 or 2, wherein the pulverulent permeable material is a carbonyl iron.

4. A proximity switch according to claim 3, wherein the flanges are fashioned from a synthetic resin enriched with a permeable material.

5. A proximity switch according to claim 4, wherein the resonant circuit coil means is wound from one of an enamelled copper wire and high-frequency braided wire.

6. A proximity switch according to claim 5, further comprising an integrated switch circuit means for forming an amplifier means of the oscillator circuit.

7. A proximity switch according to one of claims 1 or 2, wherein the flanges are fashioned from a synthetic resin enriched with a permeable material.

8. A proximity switch according to one of claims 1 or 2, wherein the resonant circuit coil means is wound from one of an enamelled copper wire and high-frequency braided wire.

9. A proximity switch according to one of claims 1 or 2, further comprising an integrated switch circuit means for forming an amplifier means of the oscillator circuit.

10. A proximity switch according to one of claims 1 or 2, wherein the metallic band consists essentially of an amorphous material of high permeability, with losses of the band determining an oscillation state of the oscillator circuit and decreasing with an increase in magnetic saturation.

11. A proximity switch according to claim 10, wherein the coil means includes only a single coil element.

12. A proximity switch according to claim 11, wherein the pulverulent permeable material is an carbonyl iron.

13. A proximity switch according to claim 12, wherein the flanges are fashioned from a synthetic resin enriched with a permeable material.

14. A proximity switch according to claim 13, wherein the resonant circuit coil means is wound from one of an enamelled copper wire and high-frequency braided wire.

15. A proximity switch according to claim 14, further comprising an integrated switch circuit means for forming an amplifier means of the oscillator circuit.

* * * * *